United States Patent
Shindo

(10) Patent No.: US 10,910,331 B2
(45) Date of Patent: Feb. 2, 2021

(54) SEMICONDUCTOR DEVICE BONDING AREA INCLUDING FUSED SOLDER FILM AND MANUFACTURING METHOD

(71) Applicant: LAPIS SEMICONDUCTOR CO., LTD., Kanagawa (JP)

(72) Inventor: Masanori Shindo, Miyazaki (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 50 days.

(21) Appl. No.: 16/181,383

(22) Filed: Nov. 6, 2018

(65) Prior Publication Data

US 2019/0139918 A1    May 9, 2019

(30) Foreign Application Priority Data

Nov. 7, 2017    (JP) ................................. 2017-214885

(51) Int. Cl.
    *H01L 23/00*      (2006.01)
    *H01L 21/683*      (2006.01)

(52) U.S. Cl.
    CPC .............. *H01L 24/05* (2013.01); *H01L 24/02* (2013.01); *H01L 24/03* (2013.01); *H01L 21/6836* (2013.01); *H01L 24/11* (2013.01); *H01L 24/13* (2013.01); *H01L 2221/6834* (2013.01); *H01L 2221/68327* (2013.01); *H01L 2224/0239* (2013.01); *H01L 2224/02311* (2013.01); *H01L 2224/02313* (2013.01); *H01L 2224/02331* (2013.01); *H01L 2224/039* (2013.01); *H01L 2224/0332* (2013.01); *H01L 2224/0345* (2013.01); *H01L 2224/0347* (2013.01); *H01L 2224/03462* (2013.01); *H01L 2224/03466* (2013.01); *H01L 2224/03614* (2013.01); *H01L 2224/03828* (2013.01); *H01L 2224/03849* (2013.01); *H01L 2224/03903* (2013.01); *H01L 2224/03914* (2013.01); *H01L 2224/0401* (2013.01); *H01L 2224/056* (2013.01); *H01L 2224/05008* (2013.01); *H01L 2224/0508* (2013.01); *H01L 2224/05024* (2013.01);

(Continued)

(58) Field of Classification Search
    CPC ................................ H01L 2224/03466; H01L 2224/03848–03849; H01L 24/03; H01L 2224/0558–05584; H01L 2224/023–0239
    See application file for complete search history.

(56) References Cited

U.S. PATENT DOCUMENTS 8,581,420 B2 * 11/2013 Tsai ........................ H01L 24/03
                                                         257/780
2004/0245630 A1 * 12/2004 Huang .................... H01L 24/05
                                                         257/737

FOREIGN PATENT DOCUMENTS

JP      2007165671 A      6/2007

* cited by examiner

*Primary Examiner* — Daniel Luke
(74) *Attorney, Agent, or Firm* — Volentine, Whitt and Francos, PLLC

(57) ABSTRACT

A semiconductor device manufacturing method including preparing a semiconductor substrate including an electrode; forming a wire connected to the electrode; forming a first insulating film including a first opening that partially exposes the wire; forming a base portion that is connected to a portion of the wire exposed via the first opening, and that includes a conductor including a recess corresponding to the first opening; forming a solder film on a surface of the base portion; and fusing solder included in the solder film by a first heat treatment, and filling the recess with the fused solder.

8 Claims, 10 Drawing Sheets

(52) U.S. Cl.
CPC ............... *H01L 2224/05027* (2013.01); *H01L 2224/05084* (2013.01); *H01L 2224/05111* (2013.01); *H01L 2224/05139* (2013.01); *H01L 2224/05147* (2013.01); *H01L 2224/05155* (2013.01); *H01L 2224/05166* (2013.01); *H01L 2224/05611* (2013.01); *H01L 2224/119* (2013.01); *H01L 2224/1132* (2013.01); *H01L 2224/1147* (2013.01); *H01L 2224/11849* (2013.01); *H01L 2224/11903* (2013.01); *H01L 2224/131* (2013.01); *H01L 2224/13026* (2013.01); *H01L 2224/13111* (2013.01); *H01L 2224/13139* (2013.01); *H01L 2924/3656* (2013.01)

US 10,910,331 B2

SEMICONDUCTOR DEVICE BONDING AREA INCLUDING FUSED SOLDER FILM AND MANUFACTURING METHOD

CROSS-REFERENCE TO RELATED APPLICATION

This application claims priority under 35 USC 119 from Japanese Patent Application No. 2017-214885, filed on Nov. 7, 2017, the disclosure of which is incorporated by reference herein.

BACKGROUND

Technical Field

The present disclosure relates to a semiconductor device and a semiconductor device manufacturing method.

Related Art

Wafer level chip size package (WL-CSP) is packaging technology for semiconductor devices, that implements formation of a redistribution, formation of an external connection terminal, resin sealing, and dicing, in wafer processes. A solder ball is often used as an external connection terminal.

For example, Japanese Patent Application Laid-Open (JP-A) No. 2007-165671 discloses a semiconductor device manufacturing method that includes: a first step in which a solder film is formed on a metal post of a mother chip, and a second step in which solder paste is printed on the mother chip and subjected to reflow after the first step, whereby forming a solder ball.

In WL-CSP, an insulating film that covers a surface of a redistribution is provided with an opening that partially expose the redistribution, and the exposed portion of the redistribution is provided with a solder ball, or an external connection terminal, through a base portion functioning as a barrier metal. The base portion includes a recess in a portion corresponding to the opening of the insulating film. The solder ball, or the external connection terminal, is formed by printing solder paste on the base portion to cover the base portion, and then performing heat treatment (reflow). However, in a case in which the base portion includes the recess, air inside the recess remains in the solder ball, even after the heat treatment (reflow), which may form a void inside the solder ball. A void inside the external connection terminal decreases a bonding strength between the semiconductor device and an object to be bonded (for example, a printed circuit board) with the external connection terminal, and increases electric resistance at a bonding part, which leads to increase of loss. In addition, long-term use of the semiconductor device may cause poor bonding. In a case in which the external connection terminal is reduced in size due to a request for a further downsized WL-CSP, a ratio (d/w) between a width w of the recess and a depth d of the recess increases, which makes it more difficult to remove the air inside the recess.

A metal post that fills the recess of the base portion may be formed by filling plating. However, this case requires a dedicated apparatus for filling plating. Furthermore, a plating solution used for filling plating has large variation in characteristics depending on compositions, which requires man-hour control for the compositions of the plating solution in order to carry out stable plating. For these reasons, employing filling plating increases costs in the manufacture of a semiconductor device.

SUMMARY

The present disclosure provides a semiconductor device and a semiconductor device manufacturing method that may prevent generation of a void inside an external connection terminal.

A first aspect of the present disclosure is a semiconductor device manufacturing method including: preparing a semiconductor substrate including an electrode; forming a wire connected to the electrode; forming a first insulating film including a first opening that partially exposes the wire; forming a base portion that is connected to a portion of the wire exposed via the first opening, and that comprises a conductor including a recess corresponding to the first opening; forming a solder film on a surface of the base portion; and fusing solder included in the solder film by a first heat treatment, and filling the recess with the fused solder.

A second aspect of the present disclosure is a semiconductor device including: a semiconductor substrate including an electrode; a wire connected to the electrode; a first insulating film including a first opening that partially exposes the wire; a base portion connected to a portion of the wire exposed via the first opening, and comprising a conductor including a recess corresponding to the first opening; and a solder film disposed on a surface of the base portion and that fills the recess.

According to the above aspects, the present disclosure provides a semiconductor device and a semiconductor device manufacturing method that may prevent generation of a void inside an external connection terminal.

BRIEF DESCRIPTION OF THE DRAWINGS

Exemplary embodiments will be described in detail based on the following figures, wherein.

DETAILED DESCRIPTION

Figure 1:
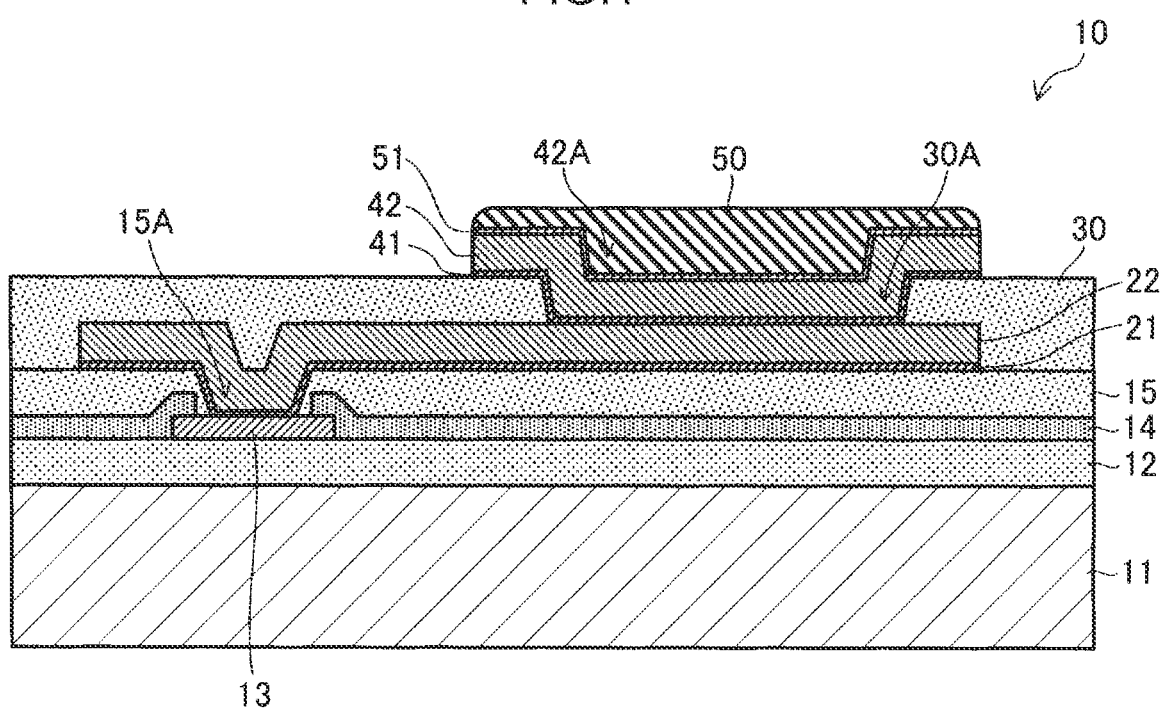
FIG. 1 is a cross-sectional view showing a configuration of a semiconductor device according to an exemplary embodiment.

Hereinafter, exemplary embodiments of present disclosure will be described with reference to the drawings. In the drawings, substantially the same or equivalent components or portions are denoted by the same reference numerals.

FIG. 1 is a cross-sectional view showing a configuration of a semiconductor device 10 according to an exemplary embodiment of present disclosure. The semiconductor device 10 includes a package which is similar to WL-CSP in shape. In other words, in the semiconductor device 10, a planar size of the package is substantially equal to a planar size of a semiconductor substrate 11. The semiconductor device 10 includes a lower insulating film 15 disposed on the semiconductor substrate 11, a redistribution 22 disposed on a surface of the lower insulating film 15, an upper insulating film 30 that covers the lower insulating film 15 and the redistribution 22, a base portion 42 connected to the redistribution 22, and a solder film 50 that covers a surface of the base portion 42.

A surface of the semiconductor substrate 11 is formed with a semiconductor element (not shown) such as a transistor, a resistor, and a capacitor. The surface of the semiconductor substrate 11 is covered with an interlayer insulating film 12 including an insulator such as $SiO_2$. A surface of the interlayer insulating film 12 is provided with a chip electrode 13 and a passivation film (protective film) 14. The chip electrode 13 is connected to the semiconductor element, and the passivation film 14 includes an opening that partly exposes a surface of the chip electrode 13.

A surface of the passivation film 14 is covered with the lower insulating film 15 having a thickness of about from 5 μm to 10 μm. The lower insulating film 15 includes a photosensitive organic insulating member such as polyimide and polybenzoxazole (PBO). The lower insulating film 15 is provided with an opening 15A that partially exposes the surface of the chip electrode 13.

On the surface of the lower insulating film 15, the redistribution 22 is disposed with an UBM film 21 therebetween. The UBM film 21 includes an adhesion layer including a Ti film to enhance adhesion between the lower insulating film 15 and the redistribution 22. The redistribution 22 includes, for example, Cu. In the opening 15A of the lower insulating film 15, the redistribution 22 is connected to the chip electrode 13.

The lower insulating film 15 and the redistribution 22 are covered with the upper insulating film 30 having a thickness of about from 5 μm to 10 μm. The upper insulating film 30 includes a photosensitive organic insulating member such as polyimide and PBO. The upper insulating film 30 is provided with an opening 30A that partially exposes the redistribution 22 at a position where the base portion 42 is formed.

The base portion 42 is connected, through the UBM film 41, to a portion of the redistribution 22 that is exposed from the opening 30A. The base portion 42 includes a Ni film having a thickness of about 5 μm. The base portion 42 functions as a barrier metal that prevents Cu included in the redistribution 22 from diffusing to the external connection terminal 60 (see FIG. 2). In the base portion 42, a height of a surface that covers a surface of the redistribution 22 and a height of a surface that covers a surface of the upper insulating film 30 are different from each other. In other words, the base portion 42 includes a recess 42A that corresponds to the opening 30A of the upper insulating film 30.

The solder film 50 includes solder containing Sn—Ag and covers the surface of the base portion 42. The recess 42A of the base portion 42 is filled with the solder film 50, and a surface of the solder film 50 that corresponds to the recess 42A is a flat plane. In other words, irregularities formed on the surface of the base portion 42, along with the formation of the opening 30A of the upper insulating film 30, are made flat by the solder film 50. The surface of the solder film 50 is not limited to a flat plane, and may have a projected curved surface.

An interface between the solder film 50 and the base portion 42 is formed with an alloy layer (Ni—Sn alloy layer) 51 which has a thickness of about 1 μm. The alloy layer 51 includes Sn contained in the solder film 50 and Ni contained in the base portion 42. The alloy layer 51 is formed by fusing the solder film 50 by heat treatment (reflow). The alloy layer 51 is covered with the solder film 50 over the entire area of the base portion 42. In other words, it is preferable that the alloy layer 51 does not appear on the surface of the solder film 50. The alloy layer 51 including Ni—Sn alloy have low solder wettability. Accordingly, with the alloy layer 51 being exposed on the surface of the solder film 50, when the base portion 42 and the external connection terminal 60 are connected through the solder film 50, solder included in the external connection terminal 60 decreases in solder wettability, which reduces a bonding strength between the base portion 42 and the external connection terminal 60. For example, in a case in which the solder film 50 has a small film thickness at the time of film formation, the alloy layer 51 may appear on the surface of the solder film 50 after the heat treatment (reflow). Therefore, the film thickness of the solder film 50 at the time of film formation is preferably thick enough not to allow the alloy layer 51 to appear on the surface of the solder film 50.

Herein, the recess 42A of the base portion 42 is filled with the solder film 50 in a case in which the following Formula (1) is satisfied. Here, V denotes a volume of the solder film 50 at the time of film formation, A denotes a volume of the recess 42A of the base portion 42, t denotes a thickness of the alloy layer 51, and S denotes an area of the base portion 42 in a contact surface between the solder film 50. Furthermore, the alloy layer 51 is prevented from appearing on the surface of the solder film 50.

$$V > A + (t \times S) \tag{1}$$

Figure 2:
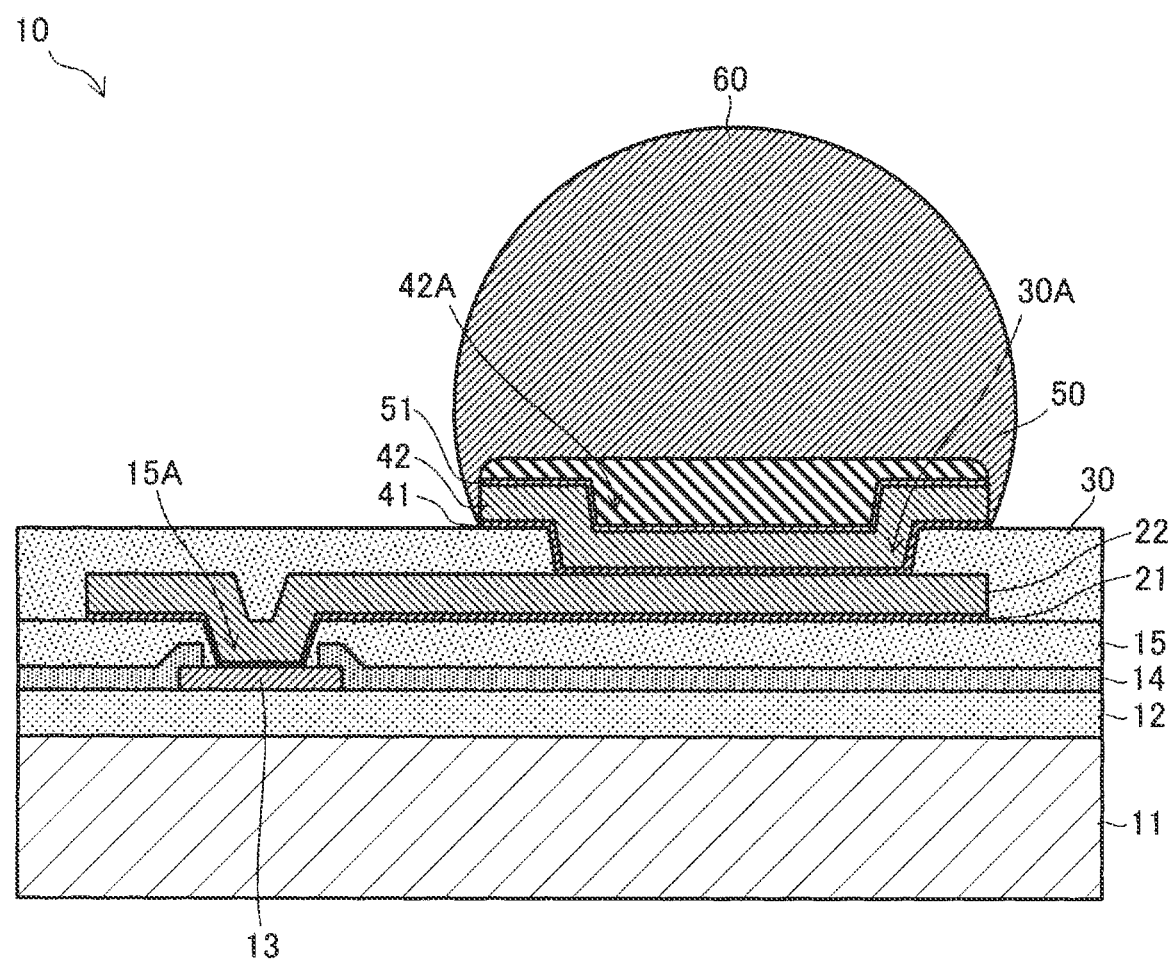
FIG. 2 is a cross-sectional view showing the configuration of the semiconductor device according to the exemplary embodiment.

As shown in FIG. 2, the semiconductor device 10 may further include the external connection terminal 60 connected to the base portion 42. The external connection terminal 60 includes the solder that contains Sn—Ag, being shaped in a solder ball. The external connection terminal 60 covers a side surface of the solder film 50, a surface of the solder film 50 which is opposite to the contact surface between the base portion 42, and a side surface of the base portion 42. In other words, the base portion 42 and the solder film 50 are buried in the external connection terminal 60. Although the external connection terminal 60 and the solder film 50 are separately shown in FIG. 2, the solder included in the external connection terminal 60 and the solder included in the solder film 50 are fused together, and the external connection terminal 60 and the solder film 50 are formed in an integrated manner.

Figure 3A:
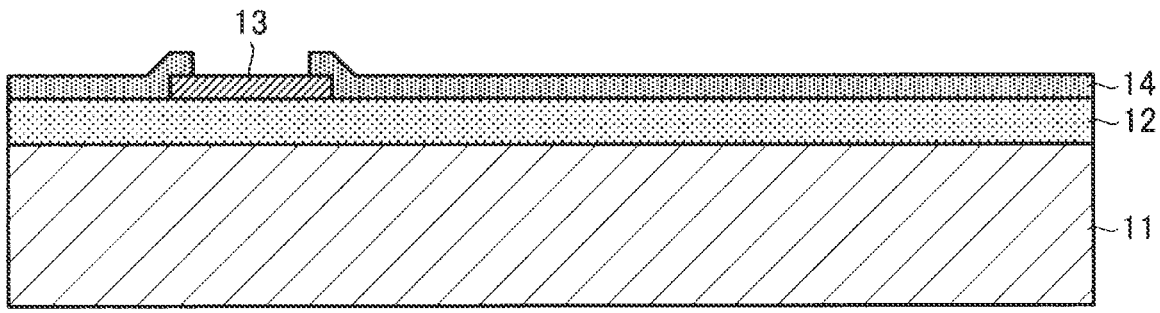
FIG. 3A to FIG. 3P are cross-sectional views each showing a semiconductor device manufacturing method according to the exemplary embodiment.
Figure 3B:
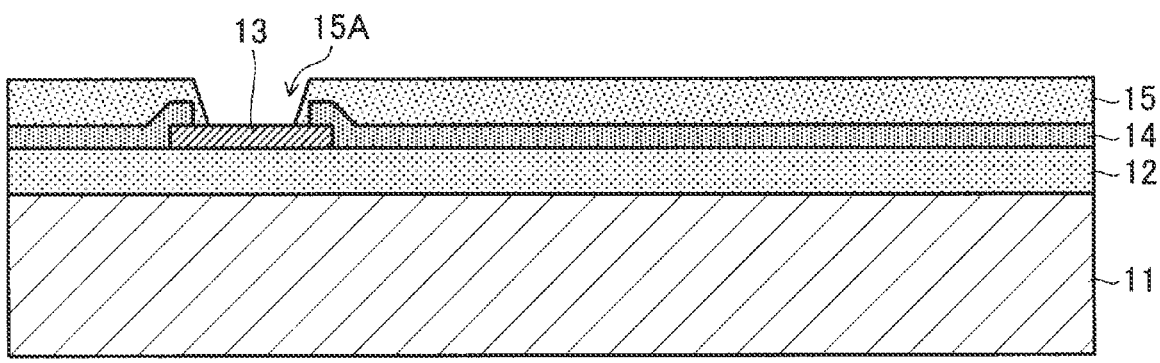
Figure 3C:
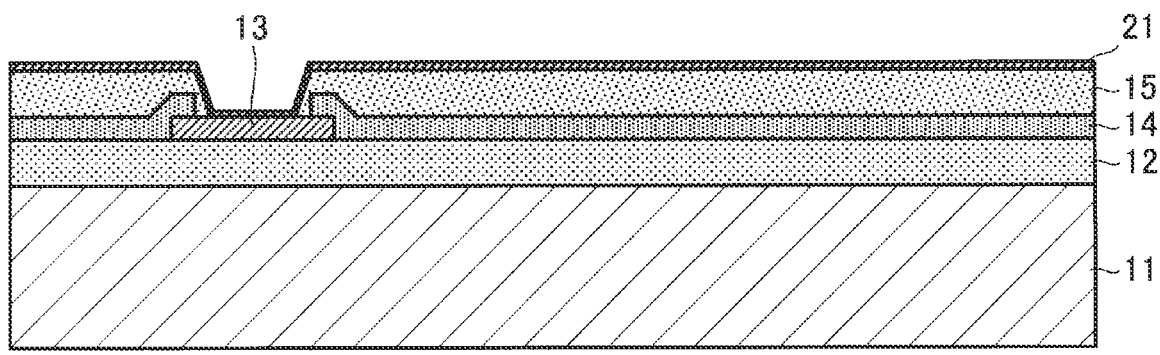

Hereinafter, a manufacturing method of the semiconductor device 10 will be described with reference to FIG. 3A to FIG. 3P. First, the semiconductor substrate 11 that has undergone wafer processes is prepared (FIG. 3A). The wafer processes includes: forming a semiconductor element (not shown) such as a transistor on the semiconductor substrate 11; forming the interlayer insulating film 12 including an insulator such as $SiO_2$ on the surface of the semiconductor substrate 11; forming the chip electrode 13 connected to the semiconductor element on the surface of the interlayer insulating film 12; and forming, on the surface of the interlayer insulating film 12, the passivation film 14 including the opening which partially exposes the chip electrode 13.

Next, for example, a photosensitive organic insulating member such as polyimide and PBO is applied by spin coating in film thickness of about 5 μm to the surface of the semiconductor substrate 11 which has undergone the wafer processes. Accordingly, the lower insulating film 15 that covers the surfaces of the passivation film 14 and the chip electrode 13 is formed. Next, the lower insulating film 15 is exposed to light and developed so that the opening 15A that partially exposes the surface of the chip electrode 13 is formed on the lower insulating film 15. The lower insulating film 15 is then cured by heat treatment. The thermal curing causes the lower insulating film 15 to contract, and a side surface of the opening 15A is formed in a forward tapered shape (FIG. 3B).

Next, the UBM film 21 that covers the surface of the lower insulating film 15 and the surface of the chip electrode 13 that is exposed in the opening 15A of the lower insulating film 15 (FIG. 3C) is formed. The UBM film 21 includes a laminated film including an adhesion layer and a seed layer. The adhesion layer enhances the adhesion between the lower insulating film 15 and the redistribution 22, and includes, for example, a Ti film having a thickness of about 150 nm. The seed layer functions as a current-carrying layer when forming the redistribution 22 by electroplating, and includes, for example, a Cu film having a thickness of about 300 nm. Each of the adhesion layer and the seed layer is formed by, for example, sputtering.

Figure 3D:
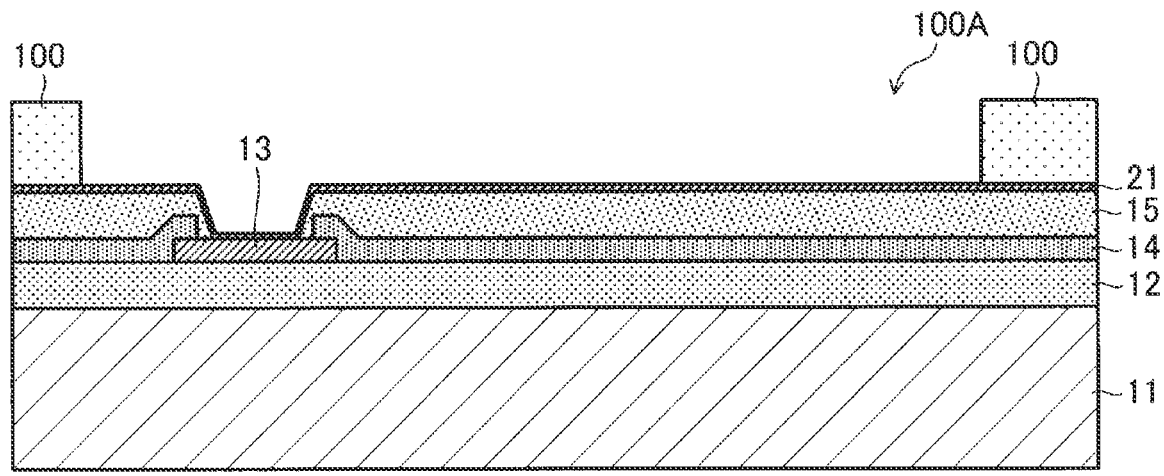

Next, a resist mask 100 including an opening 100A in an area for forming the redistribution 22 is formed on the UBM film 21 (FIG. 3D). The resist mask 100 is formed by applying a resist material including a photosensitive organic insulating member to the UBM film 21 by spin coating, and then, the resist material is patterned by exposure and development.

Figure 3E:
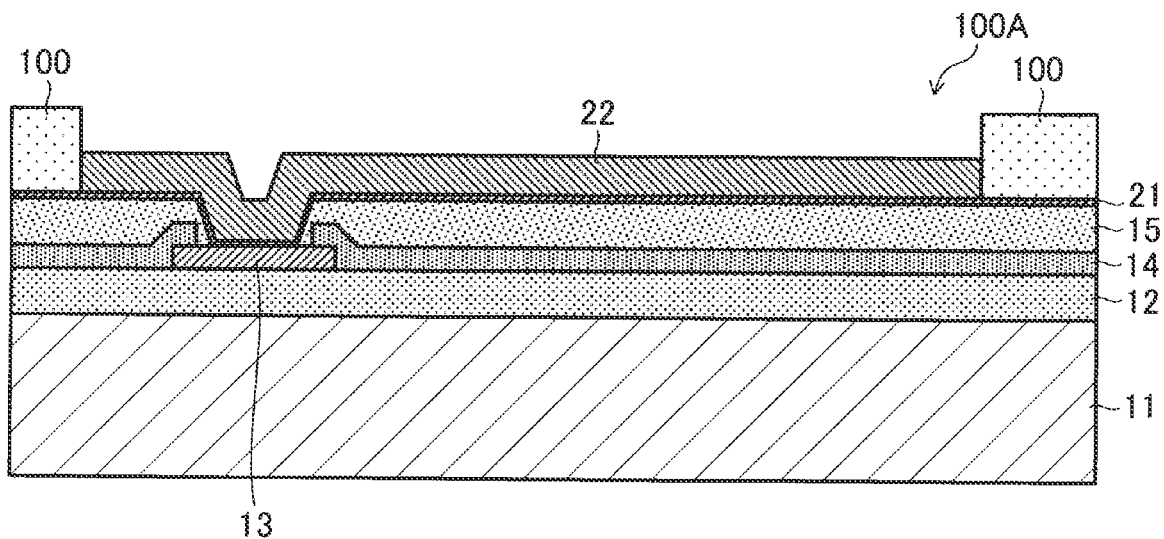

Next, the redistribution 22 including a Cu film which has a thickness of about 5 μm is formed by electroplating on the UBM film 21 exposed in the opening 100A of the resist mask 100 (FIG. 3E). In the electroplating, while the surface of the semiconductor substrate 11 is immersed in a plating solution, a current is applied to the seed layer included in the UBM film 21 through a plating electrode (not shown) disposed on the outer periphery of the semiconductor substrate 11. Accordingly, Cu is precipitated on the exposed portion of the UBM film 21, and the Cu film included in the redistribution 22 is formed on the UBM film. The seed layer included in the UBM film 21 is incorporated into Cu of the redistribution 22.

Figure 3F:
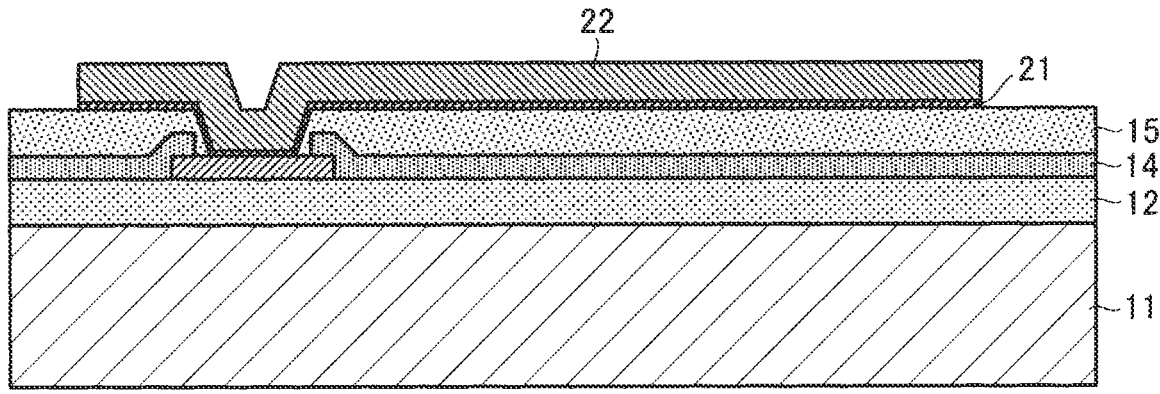

Next, the resist mask 100 is removed by an ashing process or with an organic solvent and the like. Subsequently, the seed layer (Cu) and the adhesion layer (Ni) included in the UBM film 21 are successively removed by wet etching, using the redistribution 22 as a mask (FIG. 3F).

Figure 3G:
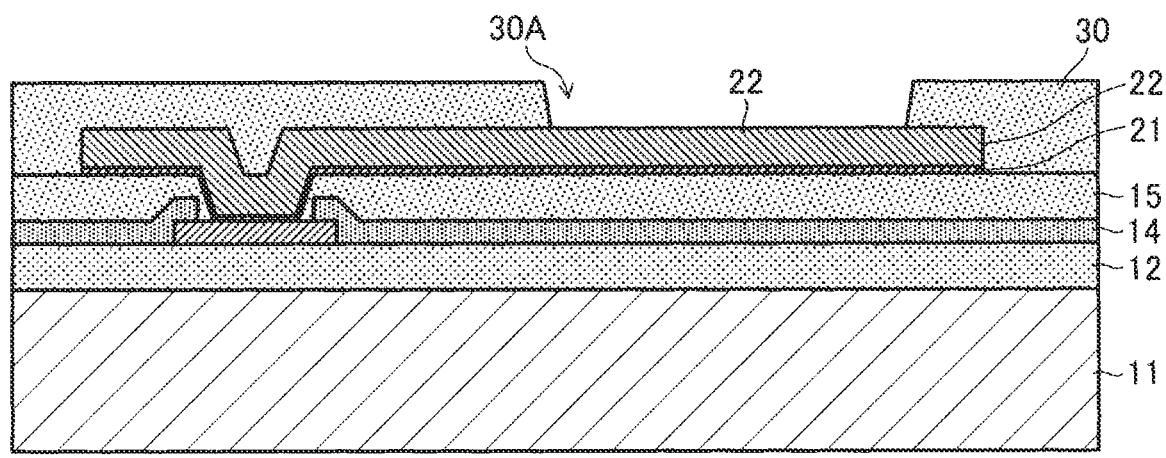

Next, for example, a photosensitive organic insulating member such as polyimide and PBO is applied by spin coating in film thickness of about 10 μm to the redistribution 22 and the lower insulating film 15. Accordingly, the upper insulating film 30 that covers the redistribution 22 and the lower insulating film 15 is formed. Subsequently, the upper insulating film 30 is exposed to light and developed so that the opening 30A that partially exposes the surface of the redistribution 22 is formed on the upper insulating film 30 at a position where the base portion 42 is to be formed. The upper insulating film 30 is then cured by heat treatment. The thermal curing causes the upper insulating film 30 to contract, and a side surface of the opening 30A is formed in a forward tapered shape (FIG. 3G).

Figure 3H:
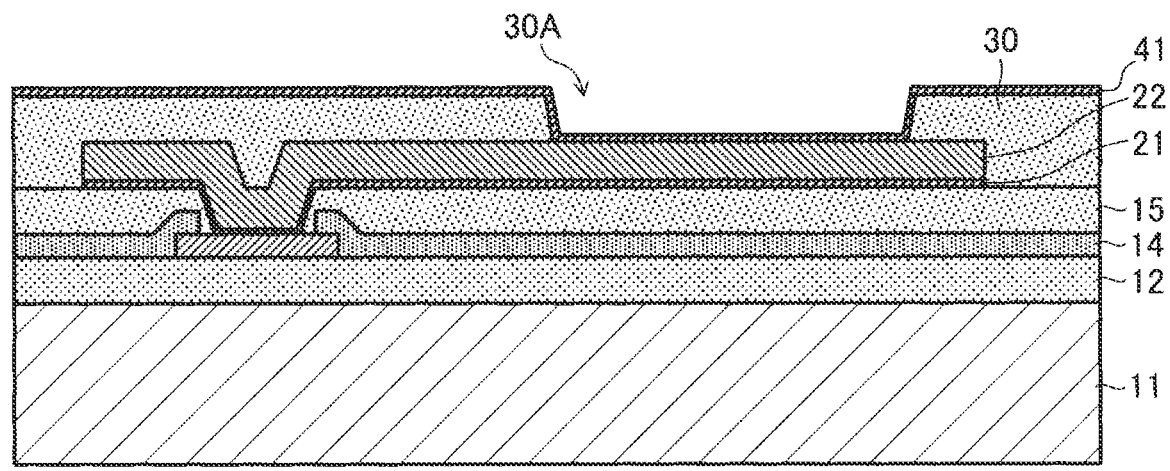

Next, the UBM film 41 that covers the surface of the upper insulating film 30 and a portion of the redistribution 22 that is exposed in the opening 30A of the upper insulating film 30 (FIG. 3H) is formed. The UBM film 41 includes a laminated film including an adhesion layer and a seed layer. The adhesion layer enhances the adhesion between the upper insulating film 30 and the base portion 42, and includes, for example, a Ti film having a thickness of about 150 nm. The seed layer functions as a current-carrying layer in forming the base portion 42 and the solder film 50 by electroplating, and includes, for example, a Cu film having a thickness of about 500 nm. Each of the adhesion layer and the seed layer is formed by, for example, sputtering.

Figure 3I:
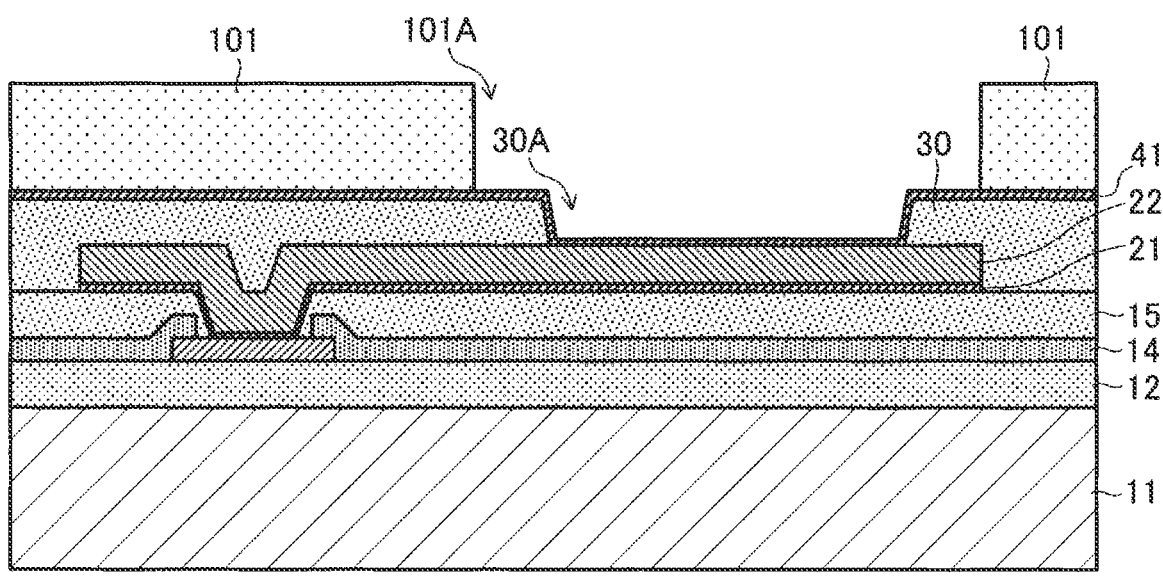

Next, a resist mask 101 that has a thickness of 20 μm and includes an opening 101A in an area for forming the base portion 42 is formed on the UBM film 41. The opening 101A of the resist mask 101 encompasses the opening 30A of the upper insulating film 30 (FIG. 3I). The resist mask 101 is formed by applying a resist material including a photosensitive organic insulating member to the UBM film 41 by spin coating and then patterning this resist material by exposure and development.

Figure 3J:
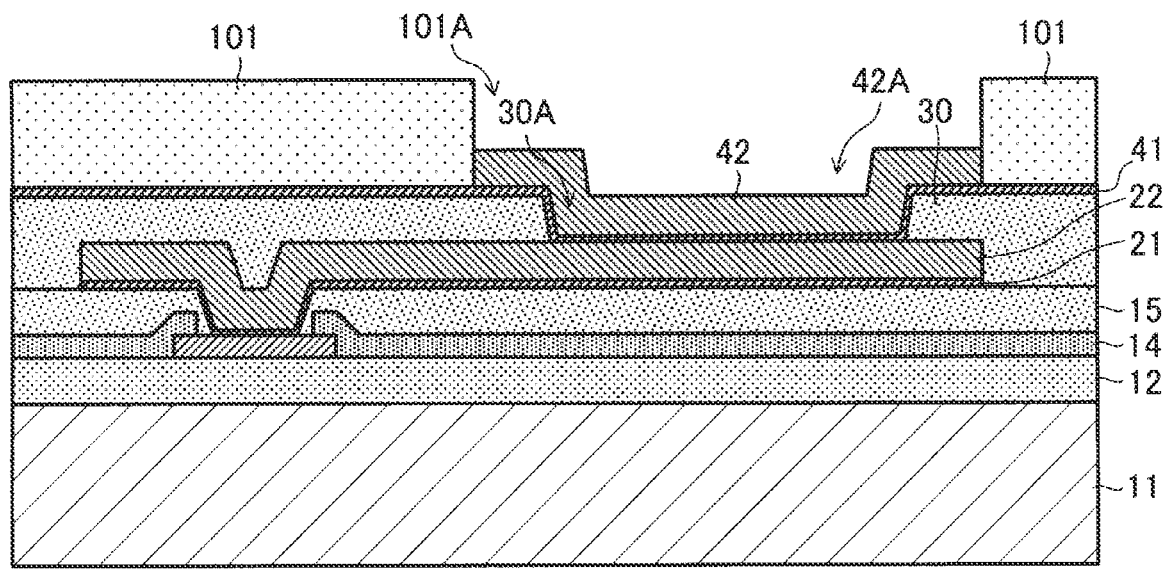

Next, the base portion 42 including an Ni film which has a thickness of about 5 μm is formed by electroplating on the UBM film 41 exposed in the opening 101A of the resist mask 101 (FIG. 3J). In the base portion 42, a height of a surface that covers a surface of the redistribution 22 and a height of a surface that covers a surface of the upper insulating film 30 are different from each other. In other words, the base portion 42 includes the recess 42A that corresponds to the opening 30A of the upper insulating film 30. The base portion 42 functions as a barrier metal that prevents Cu included in the redistribution 22 from diffusing to the external connection terminal 60 (see FIG. 2).

Figure 3K:
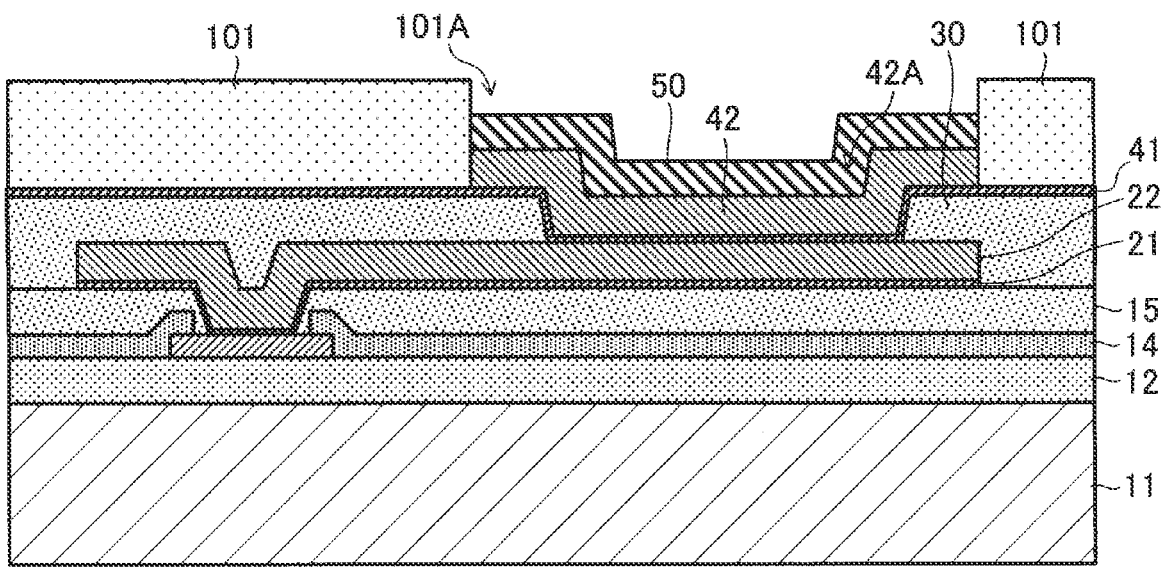

Next, the solder film 50 which contains Sn—Ag and has a thickness of about 5 μm is formed by electroplating on the base portion 42 exposed in the opening 101A of the resist mask 101 (FIG. 3K). Accordingly, a laminated film including the base portion 42 and the solder film 50 is formed in the opening 101A of the resist mask 101. The solder film 50 is formed with the resist mask 101 common to the resist mask 101 used for forming the base portion 42. The solder film 50 is formed along the surface of the base portion 42 and has a recess that corresponds to the recess 42A of the base portion 42. Herein, the volume V of the solder film 50 at the time of film formation satisfies the above Formula (1).

On the other hand, a height of the surface of the solder film 50 is lower than a height of a surface of the resist mask 101. The solder film 50 formed by plating grows isotropically with lapse of the treatment time. In WL-CSP where the external connection terminal 60 (see FIG. 2) is formed to have a high density, when the height of the surface of the solder film 50 exceeds the height of the surface of the resist mask 101, the solder film 50 expands in a lateral direction on the resist mask 101, which may cause a short circuit between the adjacent external connection terminal 60. Making the height of the surface of the solder film 50 lower than the height of the surface of the resist mask 101 prevents a short circuit between the adjacent external connection terminal 60. For example, in a case in which the resist mask 101 has a thickness of 20 μm and the base portion 42 has a thickness of 5 μm, the solder film 50 preferably has a thickness of 15 μm or less.

Figure 3L:
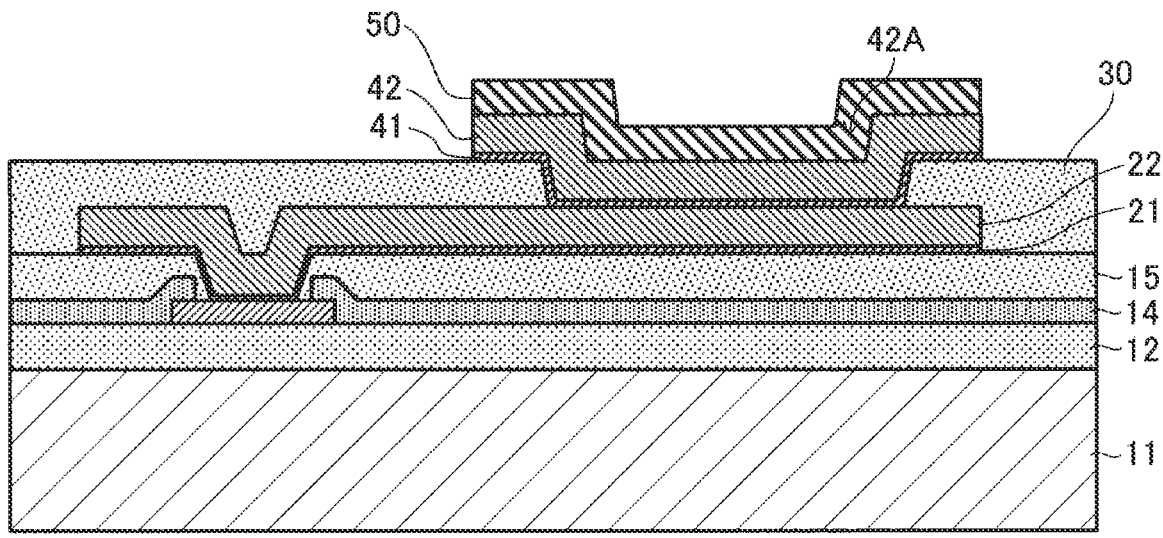

Next, the resist mask 101 is removed by an ashing process or with an organic solvent and the like. Subsequently, the seed layer (Cu) and the adhesion layer (Ni) included in the UBM film 41 are successively removed by wet etching, using the solder film 50 and the base portion 42 as a mask (FIG. 3L).

Figure 3M:
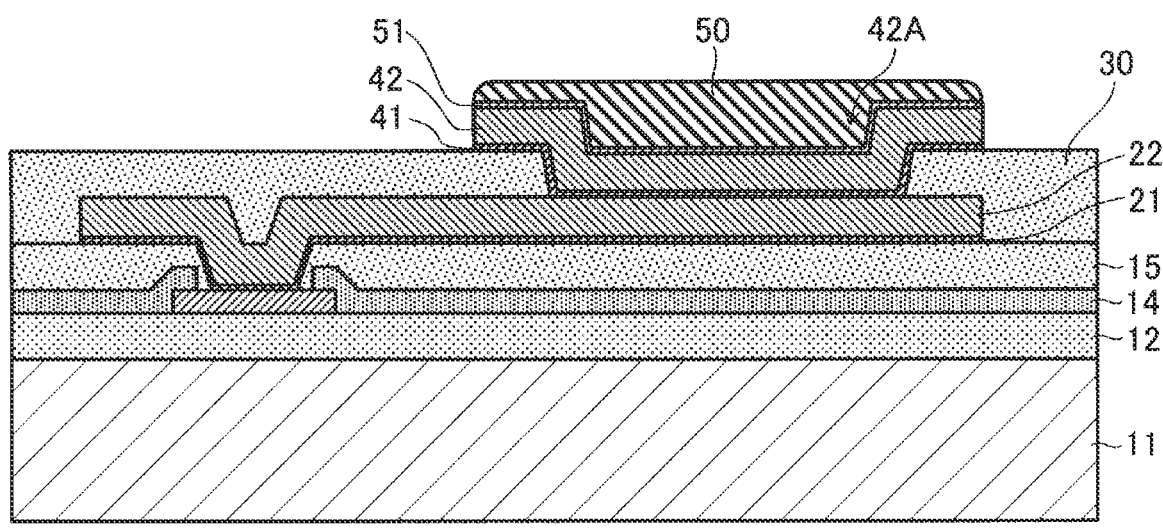

Next, flux is applied onto the upper insulating film 30 and the solder film 50, and then, heat treatment (reflow) is performed to fuse the solder included in the solder film 50. The fused solder flows into the recess 42A of the base portion 42. In addition, Sn—Ag contained in the solder film 50 reacts with Ni contained in the base portion 42, and the alloy layer 51 including Ni—Sn alloy is formed at the interface between the solder film 50 and the base portion 42. In a case in which the volume V of the solder film 50 at the time of film formation satisfies the above Formula (1), the solder film 50 thoroughly fills the recess 42A of the base portion 42. Furthermore, the alloy layer 51 is covered with the solder film 50 over the entire area of the base portion 42. In other words, the solder film 50 is formed to have a thickness such that the alloy layer 51 does not appear on the surface of the solder film 50. In this exemplary embodiment, the solder film 50 is formed to have a thickness that makes the surface of the solder film 50 flat (FIG. 3M). The surface of the solder film 50 is not limited to a flat plane but may be a projected curved surface. The heat treatment (reflow) in this step is an example of first heat treatment in present disclosure.

Figure 3N:
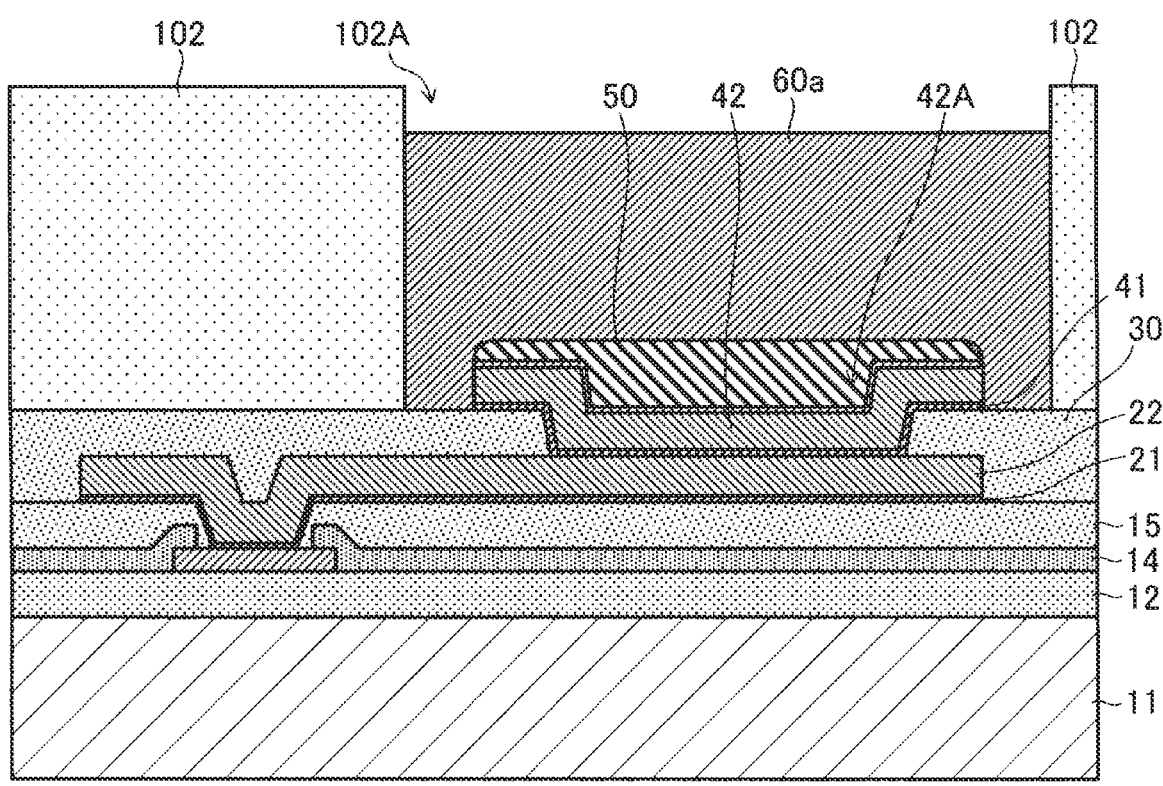

Next, solder paste 60a containing Sn—Ag is formed by printing, using a printing mask 102 that includes an opening 102A internally including the base portion 42 and the solder film 50. The solder paste 60a is filled in the opening 102A of the printing mask 102, and the solder film 50 and the base portion 42 are buried in the solder paste 60a. In other words, the solder paste 60a covers the side surface of the solder film 50, the surface of the solder film 50 which is opposite to the contact surface between the base portion 42, and the side surface of the base portion 42. The recess 42A of the base portion 42 is filled with the solder film 50, so that the air inside the recess 42A is prevented from remaining in the solder paste 60a (FIG. 3N).

Figure 3O:
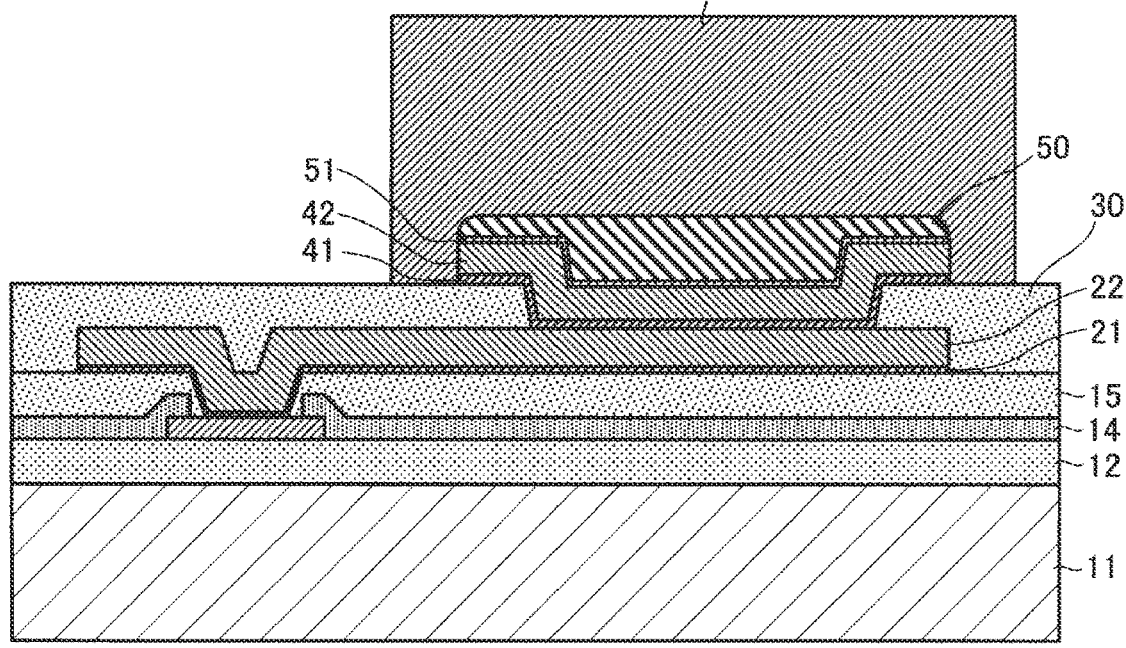
Figure 3P:
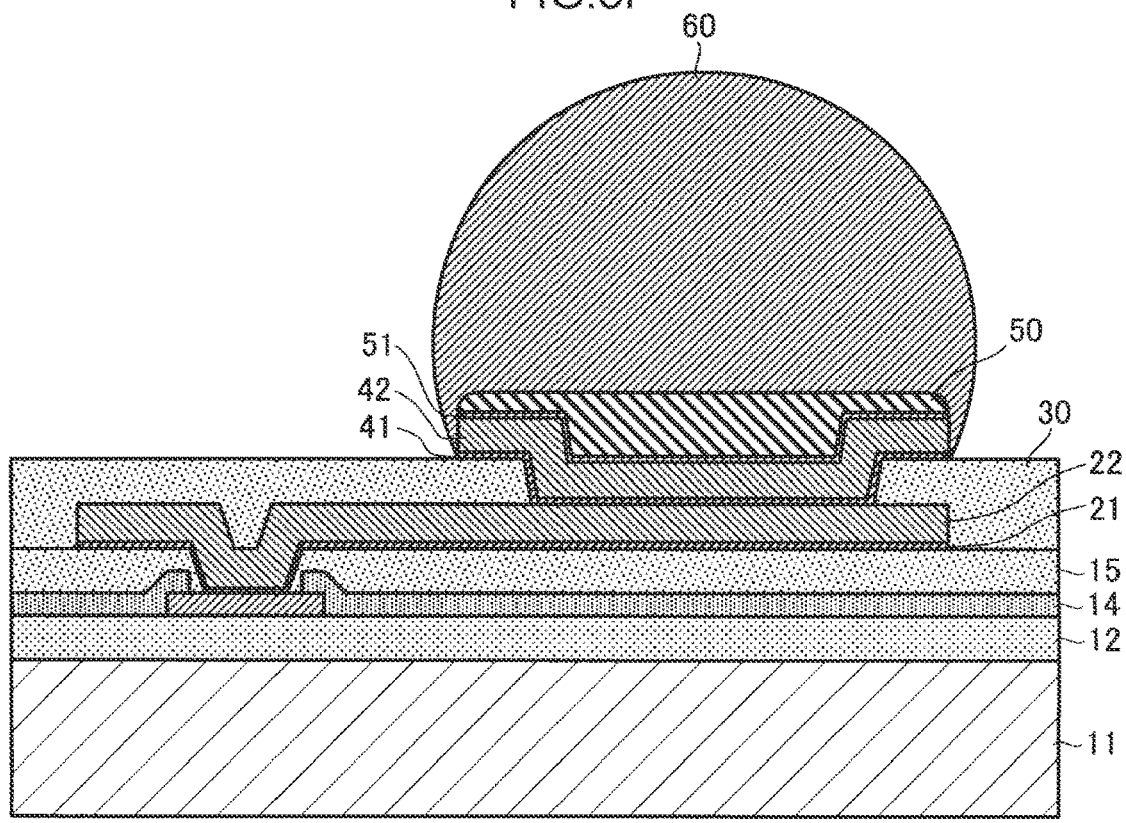

Next, the printing mask 102 is removed (FIG. 3O). Then, second heat treatment (reflow) is performed to fuse the solder paste 60a. Accordingly, the solder paste 60a is shaped into a ball, whereby forming the external connection terminal 60 with a solder ball shape (FIG. 3P). The second heat treatment fuses the solder included in the solder film 50 and fuses the solder film 50 together with the external connection terminal 60. As described above, the recess 42A of the base portion 42 is filled with the solder film 50, so that the air inside the recess 42A is prevented from remaining in the solder paste 60a, which may prevent generation of a void inside the external connection terminal 60. A protective tape may be attached to the surface of the upper insulating film 30 before the external connection terminal 60 is formed, and the semiconductor substrate 11 may be thinned by grinding the semiconductor substrate 11 from the back of the semiconductor substrate 11. The heat treatment (reflow) in this step is an example of second heat treatment in present disclosure.

After the above steps, the semiconductor substrate 11 is divided into plural semiconductor devices, whereby forming the WL-CSP type semiconductor device 10.

According to the semiconductor device 10 and the manufacturing method thereof according to the present exemplary embodiment, the recess 42A of the base portion 42 is filled with the solder film 50 provided between the base portion 42 and the external connection terminal 60. Therefore, the present exemplary embodiment may prevent the air inside the recess 42A from remaining in the solder paste 60a and may prevent generation of a void inside the external connection terminal 60. This may ensure a sufficient strength in bonding between the semiconductor device 10 and an object to be bonded (for example, a printed circuit board) with the external connection terminal 60, and may suppress electric resistance at a bonding part. In addition, it is possible to reduce the risk of poor bonding due to long-term use. Furthermore, in response to a request for a further downsized WL-CSP, the present exemplary embodiment may downsize the external connection terminal and may make the external connection terminal 60 to have a higher density.

According to the semiconductor device 10 and the manufacturing method thereof according to this exemplary embodiment, the solder film 50 is formed such that the volume V at the time of film formation satisfies the above Formula (1). Thus, the alloy layer 51 is covered with the solder film 50 over the entire area of the base portion 42. The alloy layer 51 prevents deterioration of the solder wettability in the external connection terminal 60 and may ensure the bonding strength between the base portion 42 and the external connection terminal 60.

The upper insulating film 30 is an example of a first insulating film in present disclosure. The opening 30A is an example of a first opening in present disclosure. The resist mask 101 is an example of a first mask in present disclosure. The printing mask 102 is an example of a second mask in present disclosure. The lower insulating film 15 is an example of a second insulating film in present disclosure. The opening 15A is an example of a second opening in present disclosure.

What is claimed is:

1. A semiconductor device manufacturing method comprising:
   preparing a semiconductor substrate including an electrode;
   forming a wire connected to the electrode;
   forming a first insulating film including a first opening that partially exposes the wire;
   forming a base portion that is connected to a portion of the wire exposed via the first opening, and that comprises a conductor including a recess corresponding to the first opening;
   forming a solder film on a surface of the base portion;
   fusing solder included in the solder film by a first heat treatment, and filling the recess with the fused solder;
   forming solder paste after the first heat treatment, the solder paste covering a surface of the solder film; and
   fusing the solder paste and the solder included in the solder film by a second heat treatment, and forming an external connection terminal connected to the base portion,
   wherein the solder film is formed by plating, the solder paste is formed by printing, and the solder film and the base portion are buried in the solder paste.

2. The semiconductor device manufacturing method according to claim 1, wherein:
   the solder film is formed using a first mask including an opening that encompasses the first opening; and
   the solder film has a thickness such that a height of the surface of the solder film does not exceed a height of a surface of the first mask.

3. The semiconductor device manufacturing method according to claim 1, wherein the solder paste is formed by the printing using a second mask that encompasses the base portion and the solder film.

4. The semiconductor device manufacturing method according to claim 1, wherein, in the first heat treatment, an alloy layer including a material of the base portion and a material of the solder film is formed at an interface between the solder film and the base portion.

5. The semiconductor device manufacturing method according to claim 4, wherein:
   a formula $V>A+(t\times S)$ is satisfied;
   wherein, V denotes a volume of the solder film at a time of film formation, A denotes a volume of the recess, t denotes a thickness of the alloy layer, and S denotes an area of the base portion in contact with the solder film.

6. The semiconductor device manufacturing method according to claim 4, wherein the alloy layer is covered with the solder film over an entire area of the base portion.

7. The semiconductor device manufacturing method according to claim 1, wherein the solder film has a flat surface after the first heat treatment.

8. The semiconductor device manufacturing method according to claim 1, further comprising forming a second insulating film including a second opening that partially exposes the electrode,
   wherein the wire is formed on a surface of the second insulating film and is connected to a portion of the electrode that is exposed via the second opening.

* * * * *